(12) United States Patent
Canaris

(10) Patent No.: US 6,487,708 B1
(45) Date of Patent: Nov. 26, 2002

(54) HIERARCHICAL LOCATION CONSTRAINTS FOR PROGRAMMABLE LAYOUTS

(75) Inventor: John A. Canaris, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 64 days.

(21) Appl. No.: 09/823,047

(22) Filed: Mar. 29, 2001

(51) Int. Cl.$^7$ .................................................. G06F 9/45
(52) U.S. Cl. .............................. 716/10; 716/7; 716/11
(58) Field of Search ............................... 716/8, 10, 17, 716/16, 3; 395/800

(56) References Cited

U.S. PATENT DOCUMENTS 6,237,129 B1 * 5/2001 Patterson et al. ............... 716/8
6,408,422 B1 * 6/2002 Hwang et al. .................. 716/3
6,421,817 B1 * 7/2002 Mohan et al. ................. 716/16

OTHER PUBLICATIONS

"Xilinx Libraries Guide", published Oct. 1995, available from Xilinx, Inc., 2100 Logic Drive, San Jose, CA 95124, pp. 4–69 to 4–97.

Xilinx's "The Programmable Logic Data Book 2000", available from Xilinx, Inc., 2100 Logic Drive, San Jose, California 95124, pp. 3–75 through 3–96.

Xilinx's "The Programmable Logic Data Book 1998", available from Xilinx, Inc. 2100 Logic Drive, San Jose, California 95124, pp. 4–5 through 4–69.

Xilinx's "Virtex–II Platform FPGA Handbook", available from Xilinx, Inc. 2100 Logic Drive, San Jose, California 95124, published Jan. 2001, pp. 33–95.

* cited by examiner

*Primary Examiner*—Tuan T. Lam
*Assistant Examiner*—Hiep Nguyen
(74) *Attorney, Agent, or Firm*—Lois D. Cartier

(57) ABSTRACT

Methods for designating target locations for circuit elements to be implemented in a programmable system. A target system is divided into blocks at various levels of hierarchy, with each block within the same higher-level block having a different identifier. A user can specify a desired location for a circuit element at any or all of these levels of hierarchy. Preferably, a desired location is specified using a single location constraint comprising a string of identifiers separated by delimiters. In one embodiment, a uniform coordinate system is applied to all blocks at a given level, even in a non-uniform programmable array. In this embodiment, a non-uniform array of logic blocks is divided into tiles, and a uniform coordinate system is applied to the tiles. Thus, any tile in the array can be addressed using a uniform coordinate system, regardless of the nature of the logic blocks comprising the tile.

38 Claims, 12 Drawing Sheets

XC4000 FPGA
(Prior Art)

Virtex FPGA
(Prior Art)

Virtex-II FPGA

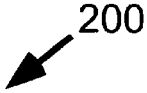
FIG. 2A (Prior Art)
FIG. 2B (Prior Art)

FIG. 2C

HIERARCHICAL LOCATION CONSTRAINTS FOR PROGRAMMABLE LAYOUTS

FIELD OF THE INVENTION

The invention relates to Field Programmable Gate Arrays (FPGAs). More particularly, the invention relates to methods for constraining circuit element positions in structured FPGA layouts.

BACKGROUND OF THE INVENTION

Programmable ICs are a well-known type of digital integrated circuit that may be programmed by a user to perform specified logic functions. One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration data may be read from memory (e.g., an external PROM) or written into the FPGA by an external device. The collective states of the individual memory cells then determine the function of the FPGA.

One type of FPGA, the Xilinx XC4000™ Series FPGA, is described in detail in pages 4–5 through 4–69 of the Xilinx 1998 Data Book entitled "The Programmable Logic Data Book 1998", published in 1998 and available from Xilinx, Inc., 2100 Logic Drive, San Jose, Calif. 95124. (Xilinx, Inc., owner of the copyright, has no objection to copying these and other pages referenced herein but otherwise reserves all copyright rights whatsoever.)

FIG. 1A shows a simplified diagram of an XC4000-Series FPGA 100. The FPGA includes a uniform array of CLBs surrounded by a ring of IOBs, as described above. (The exemplary arrays herein are shown smaller than actual logic arrays in order to facilitate clear and simple drawings, but actual logic arrays typically include many more rows and columns of elements.) The CLB array typically includes variations in routing, for example at the outer edges and/or the center of the array, but the CLB array is considered uniform for purposes of this discussion because all of the logic blocks are similar. Each CLB includes two 4-input function generators, one 3-input function generator, and two flip-flops, in addition to other logic.

A more advanced FPGA is the Xilinx Virtex® FPGA, which in addition to the CLBs includes blocks of Random Access Memory (RAM). The Xilinx Virtex-II FPGA is described in detail in pages 3–75 through 3–96 of the Xilinx 2000 Data Book entitled "The Programmable Logic Data Book 2000", published April, 2000, available from Xilinx, Inc., 2100 Logic Drive, San Jose, Calif. 95124.

FIG. 1B shows a simplified diagram of a Virtex FPGA 110. The FPGA includes a uniform array of CLBs, flanked by two columns of RAM blocks, with a ring of IOBs around the CLBs and RAM blocks. The Virtex CLB is organized into two functionally similar blocks called "slices", each of which includes two 4-input function generators and two flip-flops, in addition to other logic. The RAM blocks, of course, include different elements and are larger than the CLBs.

An even more advanced FPGA is the Xilinx Virtex®-II FPGA, which in addition to the CLBs includes blocks of Random Access Memory (RAM) and blocks implementing multiplier functions. (The Xilinx Virtex-II FPGA is described in detail in pages 33–75 of the "Virtex-II Platform FPGA Handbook", published January, 2001, available from Xilinx, Inc., 2100 Logic Drive, San Jose, Calif. 95124.) The RAM and multiplier blocks are interspersed within the CLB array, forming a non-uniform array of logic blocks, as shown in FIG. 1C.

FIG. 1C shows a simplified diagram of a Virtex-II FPGA 120. The FPGA includes an array of CLBS, with columns of RAM blocks and multiplier blocks inserted within the CLB array. The resulting logic array is therefore non-uniform in nature, including three different kinds of logic blocks. The logic array is surrounded by a ring of IOBs, the IOB ring also including Digital Clock Manager (DCM) logic blocks. The Virtex-II FPGA also includes other types of logic blocks, but these are omitted from FIG. 1C for the sake of clarity. The Virtex-II CLB is organized into four slices, each of which includes two 4-input function generators and two flip-flops, in addition to other logic. Each CLB also includes two tristate buffers. The RAM blocks and multiplier blocks include different elements from the CLBs. The RAM and multiplier blocks are designed such that the height of each block is a multiple of the CLB height.

As FPGA designs increase in complexity, they reach a point at which the designer cannot deal with the entire design at the gate level. Where once a typical FPGA design comprised perhaps 5,000 gates, FPGA-designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of predeveloped blocks of logic have been developed that can be included in an FPGA design. Such library modules include, for example, adders, multipliers, filters, and other arithmetic and DSP functions from which complex designs can be readily constructed. The use of predeveloped logic blocks permits faster design cycles, by eliminating the redesign of duplicated circuits. Further, such blocks are typically well tested, thereby making it easier to develop a reliable complex design.

To offer the best possible performance, some library modules have a fixed size and shape, with relative location restrictions on each element. One type of module having a fixed size and shape is the Relationally Placed Macro (RPM) from Xilinx, Inc. RPMs are described in pages 4–96 and 4–97 of the "Libraries Guide" (hereinafter referred to as the "Xilinx Libraries Guide"), published October 1995 and available from Xilinx, Inc. An RPM is a schematic that includes constraints defining the order and structure of the underlying circuits. The location of each element within the RPM is defined relative to other elements in the RPM, regardless of the eventual placement of the RPM in the overall design. For example, an RPM might contain 8 flip-flops constrained to be placed into four XC4000 CLBs in a vertical column. The column of four CLBs can then be placed anywhere in any XC4000 Series FPGA.

Relative CLB locations in an RPM are specified using a Relative Location constraint called "RLOC". RLOC constraints are described in detail in pages 4–71 through 4–95 of the Xilinx Libraries Guide. FIG. 2A shows how RLOC constraints are related to physical location in an array of XC4000 Series logic blocks, and how they are associated with assigned coordinates. Elements having an RLOC value of R0C0 are located in a given CLB corresponding to the (0,0) coordinate location. The next CLB "below" the (0,0) CLB is designated as R1C0, corresponding to the (0,1) coordinate location. When the FPGA design is mapped and placed by the FPGA implementation tools (prior to the final routing step), these RLOC constraints are referenced and, in effect, make the RPM a "jigsaw puzzle piece" to be fitted into the FPGA along with other elements and/or modules. Although the RPM has a rigid size and shape, other logic can be placed within the borders of the RPM.

Logic can also be mapped to elements within the logic block. For example, the function generators and flip-flops inside a CLB can be directly addressed using RLOC constraints. For example, in an XC4000 Series FPGA, the "F" function generator within the (0,0) CLB is addressed by assigning the constraint "RLOC=R0C0.F" to the logic element assigned to that location. The "Y" flip-flop in the same CLB is addressed by assigning the constraint "RLOC=R0C0.FFY", and so forth.

Some users, such as those requiring the maximum possible performance, the smallest possible implementation, or an exact pinout, want to specify exact locations for their circuit elements, rather than relative locations. To specify an exact location, the "LOC" attribute is used. The LOC attribute is similar to the RLOC attribute except that the implementation software always places the constrained element in the exact location specified. Other location constraints are also typically supported. For example, the Xilinx FPGA implementation tools support, in addition to the RLOC and LOC attributes, the location attributes U_SET, H_SET, and so forth. However, the RLOC attribute is used herein as an exemplary location constraint.

FIG. 2A shows a uniform CLB array 200, such as those in an XC4000 Series FPGA. Each CLB in the array has a unique set of coordinates, e.g., (0,0) for the CLB in the upper left corner. To place a circuit element into a particular CLB, an RLOC attribute is attached to the element, referencing the coordinates of the target CLB. For example, attaching the constraint "RLOC=R0C0" tells the FPGA implementation tools to place the element into the CLB at coordinates (0,0) in the upper left corner of the array.

FIG. 2B shows an array 210 of logic blocks in a Virtex FPGA. (The numbers and relative sizes of CLBs and RAM blocks in the figures herein are not representative of actual Virtex and Virtex-II FPGAs.) A centrally-located array of CLBs uses the same coordinate system as the array of FIG. 2A. The flanking columns of RAM blocks use a similar coordinate system separate from the coordinate system of the CLBs. For example, the RAM block closest to the upper left corner of the array has the coordinates (0,0). This duplication of coordinates can lead to a duplication of RLOC constraints, with both the upper left CLB and the upper left RAM block being specified by attaching the constraint "RLOC=R0C0". However, each circuit element from a library of available elements implies a particular type of logic block, so the FPGA implementation tools are able to correctly target the circuit elements to the intended locations. Another solution to this duplication problem is to require the location constraint to include information as to the type of the destination logic block, e.g., "RLOC=RAMB4_R0C0".

FIG. 2C shows how this method of specifying locations can be extended to the Virtex-II FPGA, which includes three types of logic blocks in the logic array. Using the previously-described method of designating relative locations, each type of logic block has a separate coordinate system, as shown in FIG. 2C. The situation is further complicated if the logic array is defined to include the ring of IOBs shown in FIG. 1C, which also includes the Digital Clock Manager (DOM) blocks and other types of blocks not shown in FIG. 1C. As can be seen from this example, methods for specifying locations in non-uniform arrays can be quite complex. It is desirable to provide a method of specifying locations that is simple and straightforward and can be used with any coordinate system applied to both uniform and non-uniform arrays.

The above-described methods for specifying circuit element positions are generally directed to low-level constraints, such as specifying a particular logic block (e.g., a particular CLB or RAM block) as a destination for the constrained circuit element. There are some known methods for constraining elements at a higher level. For example, the location constraint "LOC=TL" attached to a decode circuit element in an XC4000 Series device constrains the element to be placed in the left half of the top edge of the FPGA, as described on pages 4–69 and 4–70 of the Xilinx Libraries Guide. Although this type of constraint is at a higher level than those previously described, these methods are still limited to a single level of hierarchy.

FPGA users often wish to implement designs too large for a single FPGA. Such a user might want to specify a particular FPGA on which a circuit element is to be placed, while also specifying a particular logic block in the target FPGA as the target destination. It is therefore desirable to provide methods for specifying circuit element positions that can be extended to multiple levels of a design hierarchy, e.g., including that of multiple FPGAs.

SUMMARY OF THE INVENTION

The invention provides methods for designating desired locations for circuit elements to be implemented in a target programmable system such as a Field Programmable Gate Array (FPGA). Location information applied to a circuit element can include hierarchical information about two or more levels of physical partitioning. According to a first aspect of the invention, a target FPGA or system is divided into blocks at various levels of hierarchy. Each block within the same higher-level block has a different identifier. A user can specify a desired location for a circuit element at any or all of these levels of hierarchy. Location information can include references to two or more of these levels, or to two or more different blocks at the same hierarchical level.

For example, a system (Level 0) can include two FPGAs, each at Level 1. Each block at Level 1 (e.g., each of the two FPGAs) must have a different identifier than each other block at Level 1. At the next level of hierarchy (Level 2), each FPGA can include an array of CLBS, an array of RAM and multiplier blocks, and an array of processor blocks. Each block at Level 2 (e.g., each CLB array, RAM/multiplier array, and processor array) has a different identifier from all of the other blocks in the same Level 1 block. Each of these blocks in turn can include other blocks (Level 3), uniquely identified within their Level 2 block. A user can specify a desired location for a circuit element at two or more levels of hierarchy, or in two different ways at the same level of hierarchy. The number of possible levels of hierarchy is limited only by the capability of the computer and software used to specify the circuit and implement the circuit in the target FPGA or system.

Preferably, a desired location is specified using a single location constraint set to a value comprising a string of identifiers separated by delimiters. Not every level need be specified. For example, a user can specify that a given circuit element be placed in a certain FPGA, without specifying a location within the FPGA. Similarly, a location within an FPGA can be specified without specifying which FPGA is to be used. A particular slice within a CLB can be specified, or the exact placement within the CLB can be left up to the implementation software. Other levels of hierarchy can be skipped or specified, as desired. In order to skip a level of hierarchy, a "placeholder" can be inserted into the text string. For example, an asterisk can be used to indicate a match to all identifiers at a given level of hierarchy. Other known methods of performing a regular expression match can also be used.

In one embodiment, a given logic block can belong to more than one larger block at a given level of hierarchy. For example, a CLB in an array of CLBs can be addressed by specifying a row of CLBs, or by specifying a column of CLBs. Where a logic block belongs to more than one larger block at the same level, two identifiers at the same level can be specified. In one embodiment, when two areas at the same level are specified, the placement is limited to an overlapping area shared by the two identified areas of the target programmable system. As long as the implementation software recognizes the identifiers used to designate the blocks at any given level of hierarchy, the identifiers can be used to specify a location constraint.

According to a second aspect of the invention, a uniform coordinate system is applied to all blocks at a given level, even in a non-uniform array. In one embodiment, a non-uniform array of logic blocks is divided into tiles of uniform size and shape, and a uniform coordinate system is applied to the tiles. Thus, any tile in the array can be addressed using a uniform coordinate system, regardless of the size, shape, or nature of the logic block or blocks comprising the tile. In another embodiment, the tiles are of uniform height but varying widths, or of uniform width but varying height. The uniform-coordinate system can still be applied. This aspect of the invention can also be applied to a system having only a single level of hierarchy.

BRIEF DESCRIPTION OF THE DRAWINGS

The present invention is illustrated by way of example, and not by way of limitation, in the following figures, in which like reference numerals refer to similar elements.

FIG. 2A shows a uniform CLB array in the FPGA of FIG. 1A, and an associated coordinate system.

FIG. 2B shows an array of CLBs and RAM blocks in the FPGA of FIG. 1B, and an associated coordinate system.

FIG. 2C shows an array of CLBS, RAM blocks, and multiplier blocks in the FPGA of FIG. 1C, and an associated coordinate system.

DETAILED DESCRIPTION OF THE DRAWINGS

The present invention has been found to be particularly applicable and beneficial when applied to field programmable gate arrays (FPGAS) including non-uniform arrays of logic blocks. While the present invention is not so limited, an appreciation of the present invention is presented by way of specific examples showing the application of the invention to various Xilinx FPGAs. However, it will be apparent to one skilled in the art that the present invention can be applied to other programmable systems including blocks of programmable logic. These blocks can be arranged in a random fashion, or can be arranged in uniform or non-uniform arrays.

Figure 3:
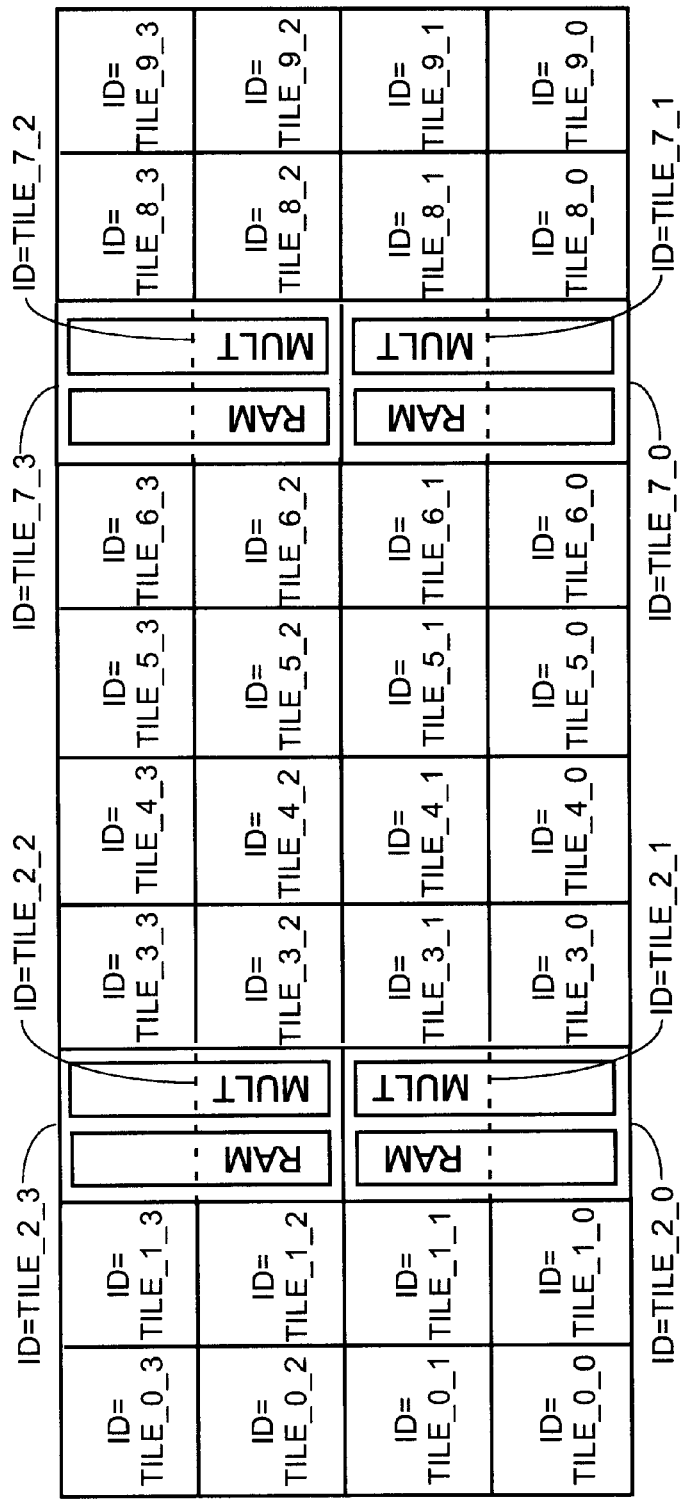
FIG. 3 shows the non-uniform array of logic blocks from FIG. 2C with an applied array of tiles.

One method for simplifying the specification of locations in a non-uniform array is to impose a uniform specification system on the non-uniform array. A non-uniform array of logic blocks with an imposed uniform coordinate system is shown in FIG. 3. In FIG. 3, only the CLBS, RAM blocks, and multiplier blocks are included in the pictured tile array, for clarity. However, the IOBs and DCMs of the FPGA of FIG. 1C can also be included in the array, along with any other desired logic blocks (not shown in FIG. 1C).

Figure 1A:
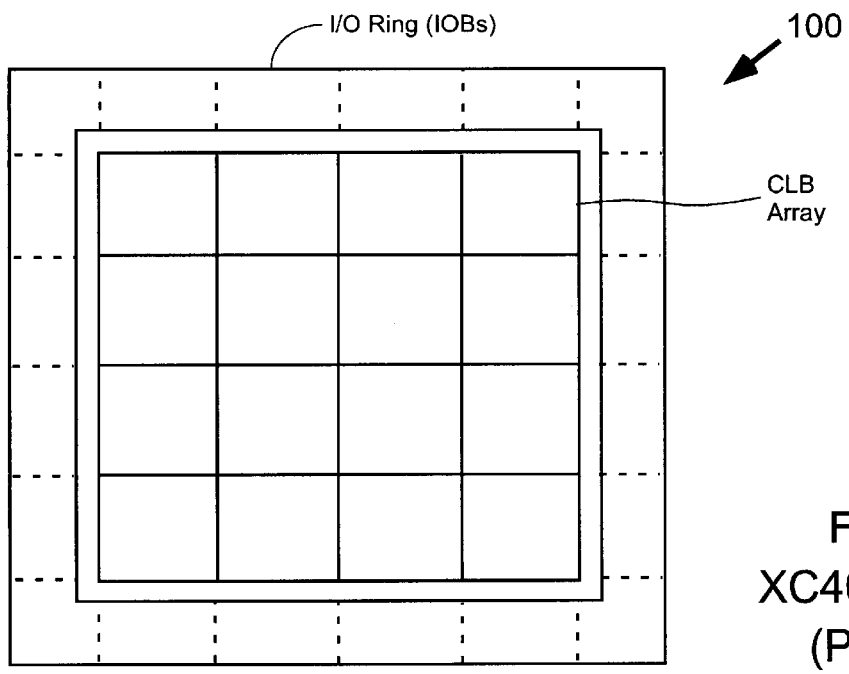
FIG. 1A shows a simplified diagram of an XC4000-Series FPGA.
Figure 1B:
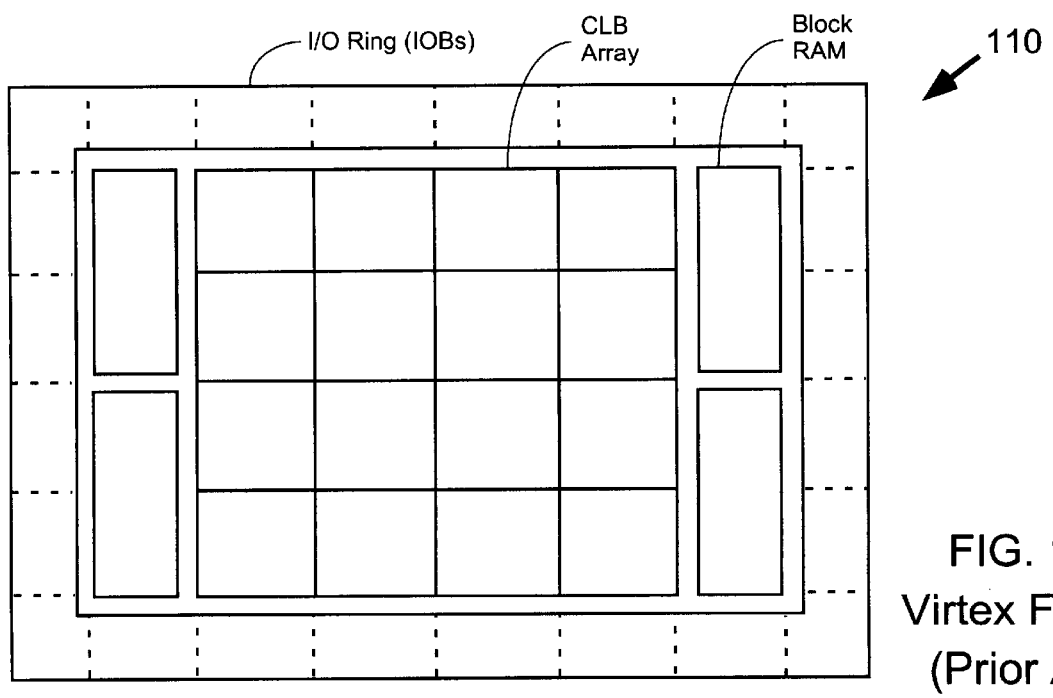
FIG. 1B shows a simplified diagram of a Virtex FPGA.
Figure 1C:
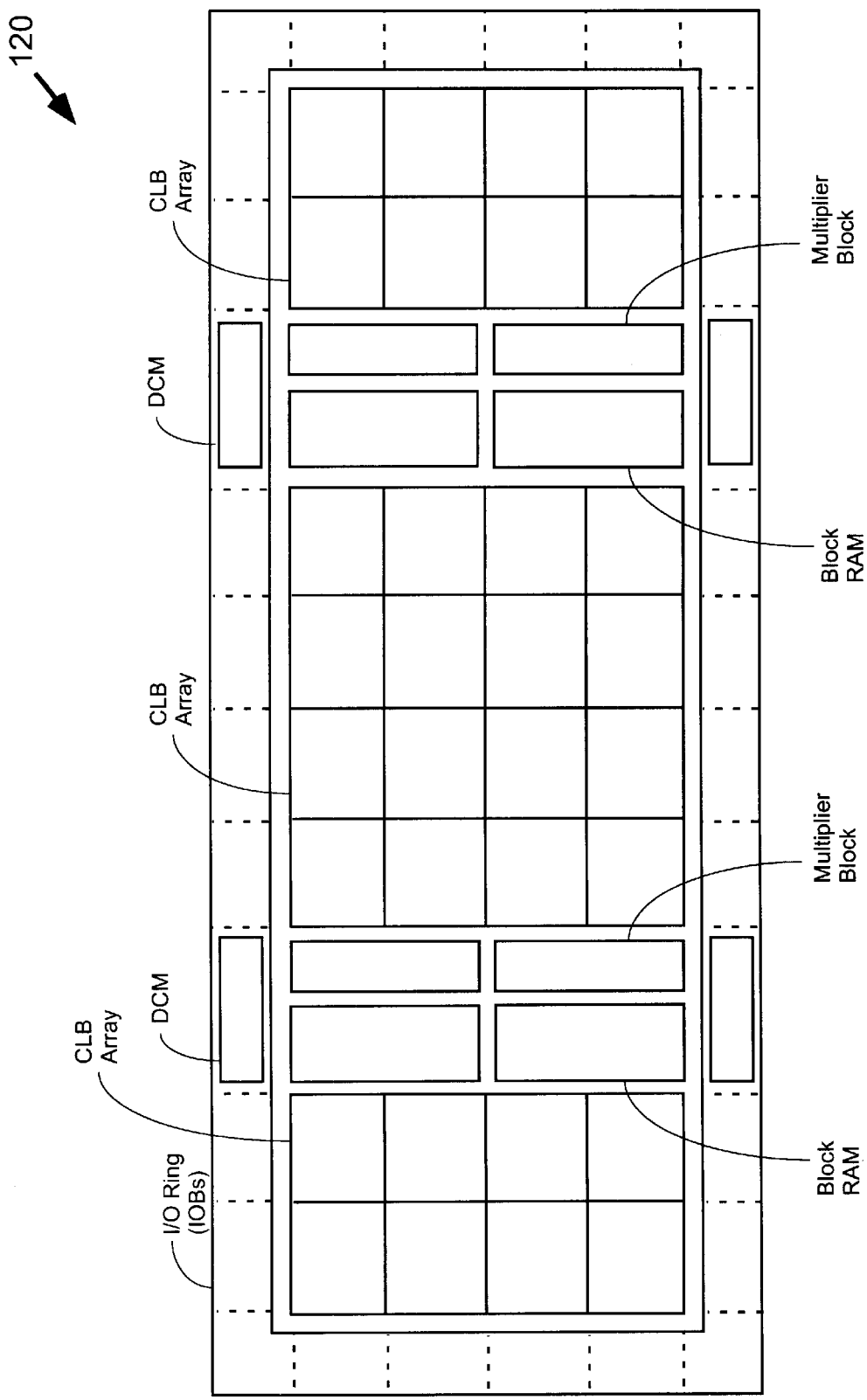
FIG. 1C shows a simplified diagram of a Virtex-II FPGA.
Figure 2C:
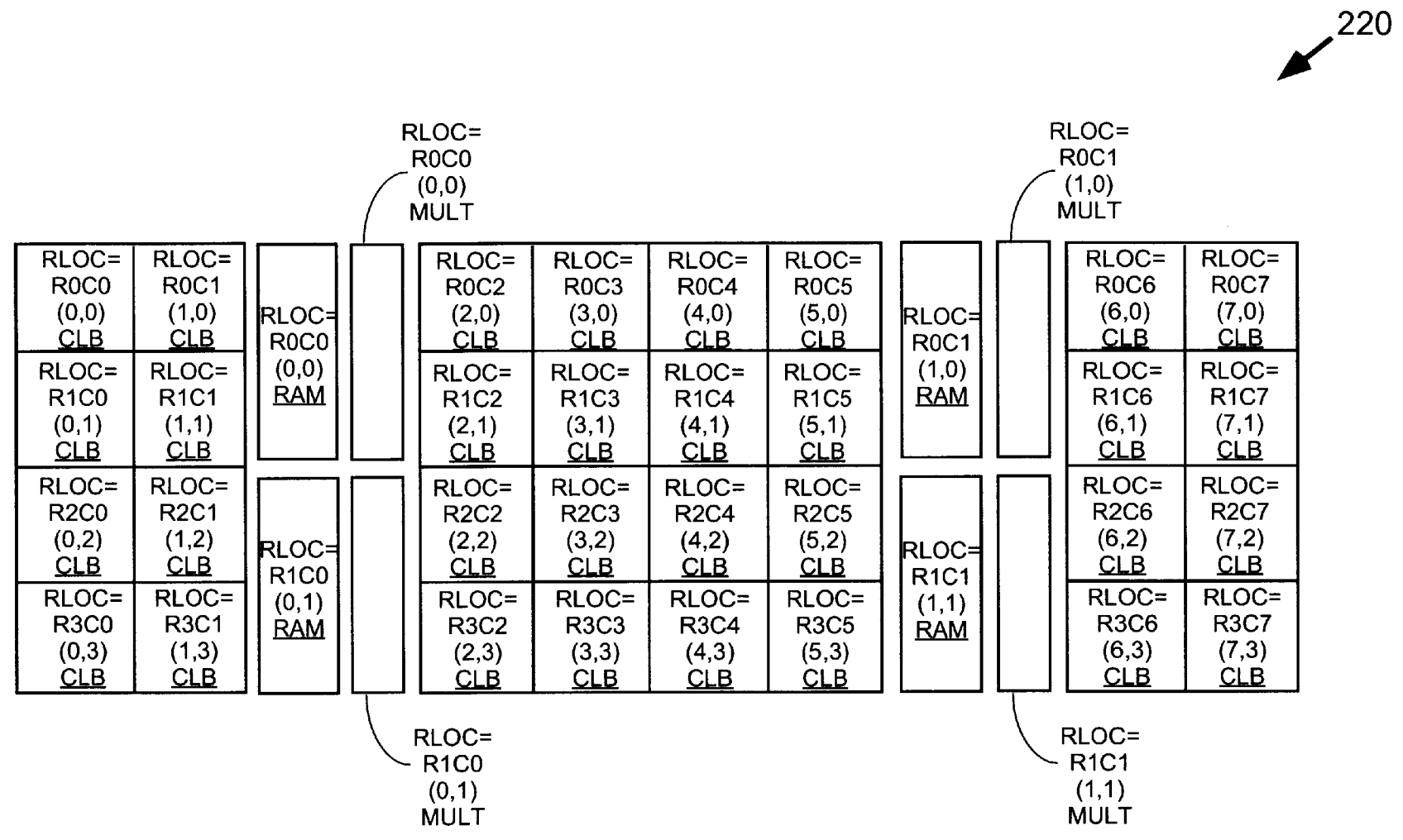

In FPGA array 300 of FIG. 3, an array of tiles has been imposed on the non-uniform array of logic blocks from FIGS. 1C and 2C. The tiles have assigned identifiers ("IDs") that in this example are based on the X,Y coordinate system. However, in other embodiments, other identifiers are used. These identifiers need not even be related to the coordinates of the tile, as long as each identifier uniquely designates a single tile in the array. For example, the tiles could be designated "A", "B", "C", and so forth. However, using tile coordinates in the identifiers can simplify the implementation software for the target FPGA.

In array 300 of FIG. 3, a location constraint applied to a circuit element takes the same form regardless of the type of logic block being targeted. For example, a circuit element to be placed in a CLB might have the constraint "RLOC= TILE_0_0", while a circuit element targeted to a RAM block can have the constraint "RLOC=TILE_2_0". Thus, this technique applies a uniform location specification system to a non-uniform array.

Note that the logic blocks of FIG. 3 are not all of the same size or shape. Some logic blocks "share" a tile (e.g., RAM and MULT blocks share tiles), while some logic blocks have more than one tile assigned to them (e.g., each RAM and MULT block has two assigned tiles). In this example, the RAM and MULT blocks together are the same width as one CLB, so the implementation software is simplified by having them share a tile. In one embodiment, a logic block having two or more assigned tiles can be addressed using the identifier of any of the assigned tiles. In one embodiment, a tile including two or more different types of logic blocks has only one identifier, and the implementation software infers the target logic block from the nature of the associated circuit element. In another embodiment, a target logic block is specified by including both the identifier of the tile, and another identifier for the logic block.

In some embodiments, the tiles are of uniform size and shape. In other embodiments, the tiles are non-uniform in size or shape. For example, in one embodiment, the tiles are of uniform height but varying widths. This embodiment can advantageously be applied to an array similar to that of FIG. 3, but where the RAM and multiplier blocks have a combined width different from that of the CLB tiles. In another embodiment, the tiles are of uniform width but varying height. The uniform coordinate system can still be applied to these arrays of tiles.

Figure 4:
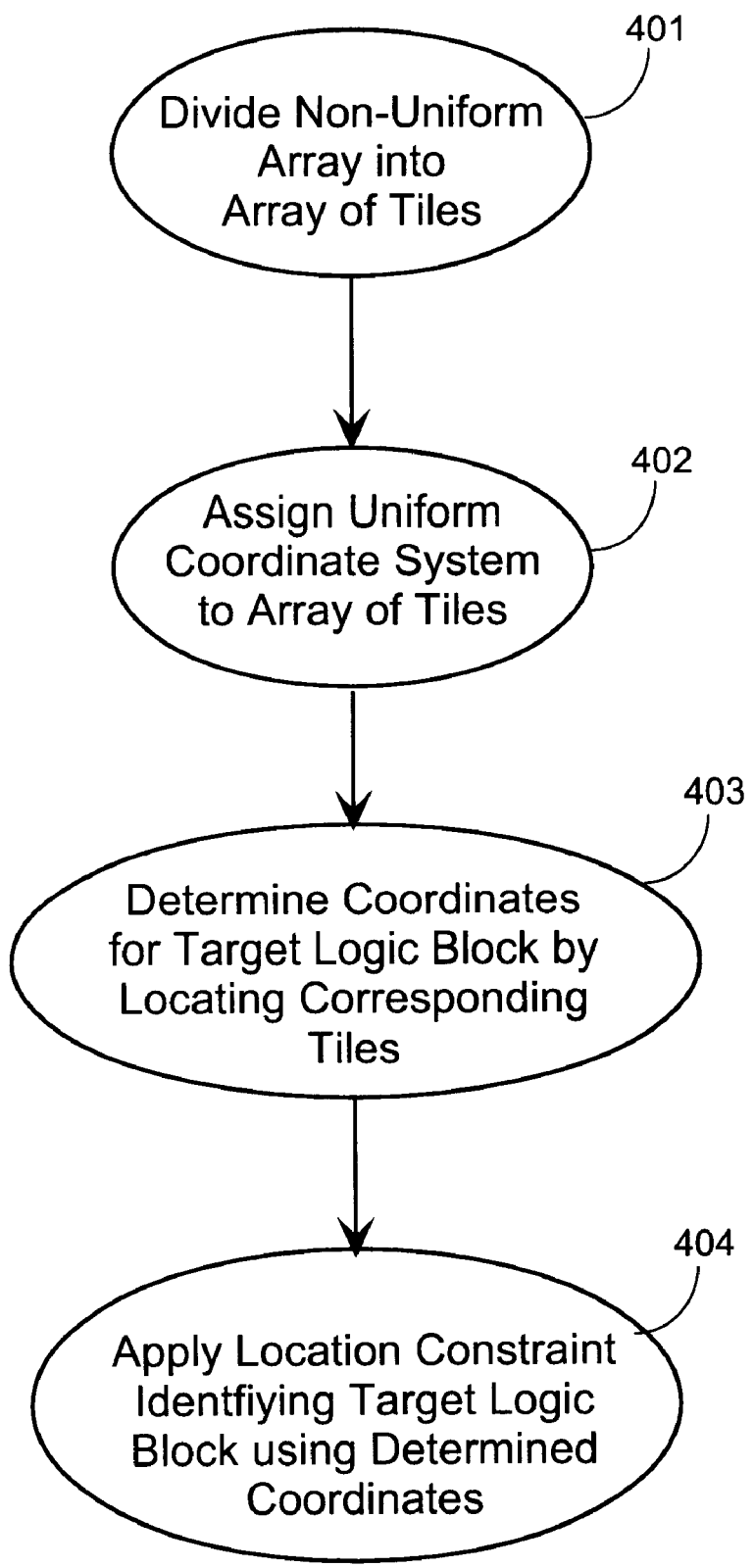
FIG. 4 is a flow diagram showing how the array of tiles from FIG. 3 is generated from the non-uniform array of FIG. 2C, and a circuit element is constrained to a specified location in the array.

FIG. 4 illustrates a method for constraining a circuit element position using the tile array described in connection with FIG. 3. At step 401, a non-uniform array (such as that of FIG. 1C or 2C) is divided into an array of tiles (such as that shown in FIG. 3). At step 402, a uniform coordinate system is assigned to the array of tiles (e.g., see FIG. 3). At step 403, coordinates for a target logic block are determined by locating the one or more corresponding tiles and determining their coordinates. At step 404, a location constraint (e.g., a RLOC attribute) is applied to a circuit element using the coordinates determined in step 403.

Figure 5:
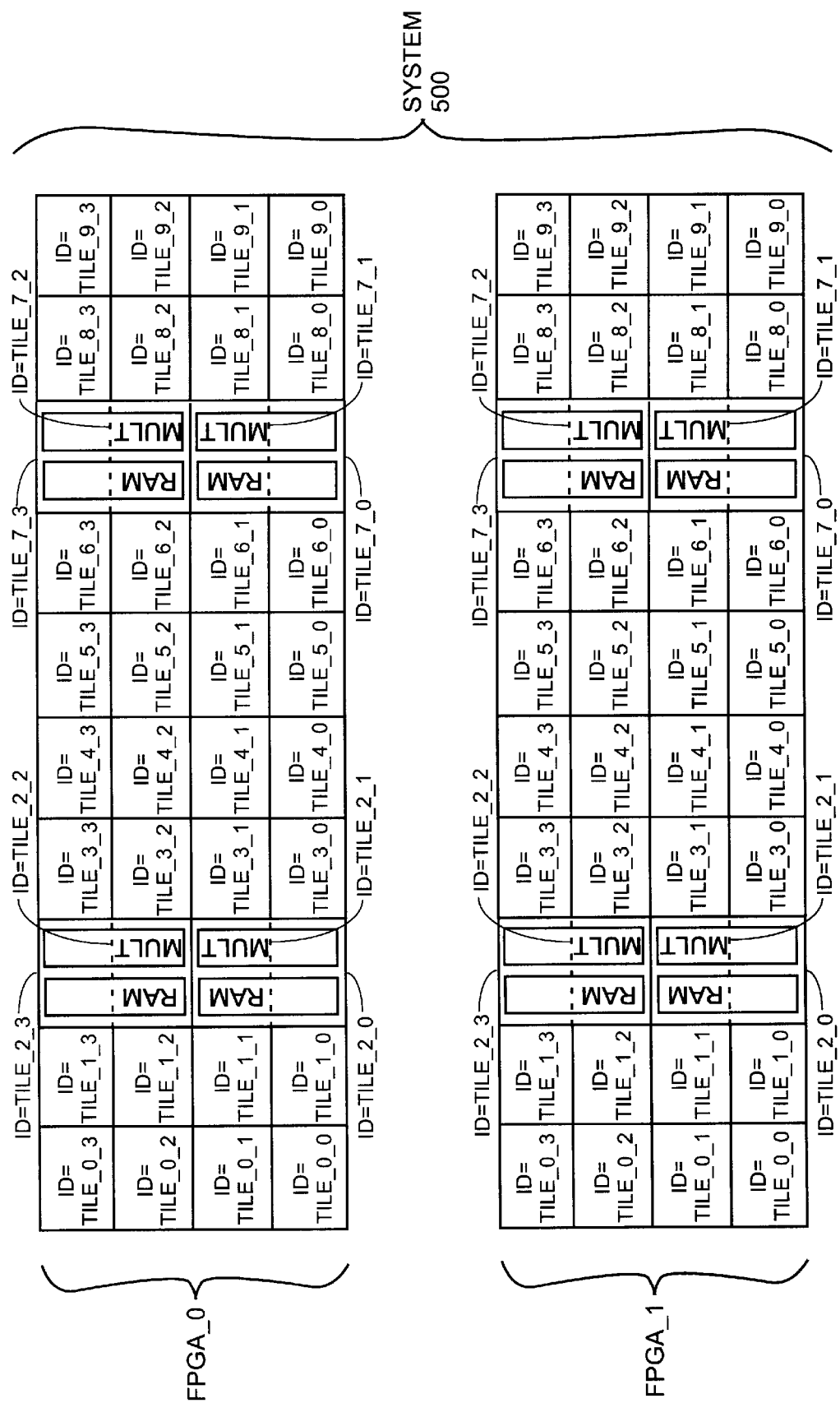
FIG. 5 shows a system including two FPGAs, each including one of the logic arrays of FIG. 3.

In FIG. 5, a tile array is applied to a hierarchical system. System 500 of FIG. 5 includes two FPGAs having the identifiers FPGA_0 and FPGA_1. Each of FPGAs FPGA_0 and FPGA_1 includes an array of logic blocks having an imposed tile array as shown in FIG. 3.

In system 500, constraints can be applied to circuit elements targeted to a specific FPGA. For example, the constraint "RLOC=FPGA_0" applied to a circuit element directs the implementation software to place the element anywhere in FPGA FPGA_0.

Constraints can also be applied to circuit elements targeted to a specific position within an FPGA, without designating which FPGA is the intended target. For example, the constraint "RLOC=TILE_0_0" can be applied to direct the implementation software to place the circuit element in the lower left tile of either FPGA.

Alternatively, a hierarchical constraint can be applied that directs the implementation software to a specific tile in a specific one of the FPGAs. In one embodiment, the identifiers at various levels of hierarchy are separated by slashes. For example, the constraint "RLOC=FPGA_0/TILE_0_0" directs the implementation software to place the element in the lower left tile of FPGA_0 only. In other embodiments, other delimiters are used instead of slashes.

In one embodiment, the implementation software requires the specification of a set number of hierarchical levels. A level with no specified location must be specified using a placeholder. In this embodiment, as applied to the system of FIG. 5, the constraint "RLOC=*/TILE_0_0" can be used, with the asterisk being the placeholder implying that TILE_0_0 of either FPGA can be used. Alternatively, the constraint "RLOC=FPGA_*/TILE_0_0" has the same meaning.

Note that in the example of FIG. 5, one level of hierarchy (the logic arrays) uses an imposed tile array and an associated uniform coordinate system, while the other level of hierarchy (the FPGAS) uses neither. As long as the identifiers of each logic block or tile are unique within the higher-level block, then whether or not a tile array is imposed, and whether or not any type of coordinate system is used to create the identifiers, is not significant except as it simplifies the use of the implementation software. In one embodiment, none of the levels uses an imposed tile array or a uniform coordinate system. In another embodiment, every level of hierarchy uses an imposed tile array and uniform coordinate system.

In one embodiment, every level has an imposed uniform coordinate system, and every level uses the same type of identifier. For example, multiple FPGAs in the system are placed into tiles, and each has an identifier including the tile coordinates. The logic arrays within the FPGAs also have an imposed tile array and uniform coordinate system, and use the same tile identifiers. In this system, a hierarchical location constraint may have two occurrences of the same tile identifier (e.g., "RLOC=TILE_0_0/TILE_0_0"), but the two occurrences refer to locations at two different hierarchical levels. In this embodiment, hierarchical levels cannot be skipped in the location constraint unless a placeholder is used, because the only way the implementation software can determine which identifier applies to which hierarchical level is by the placement of each identifier in the location constraint text string.

Figure 6:
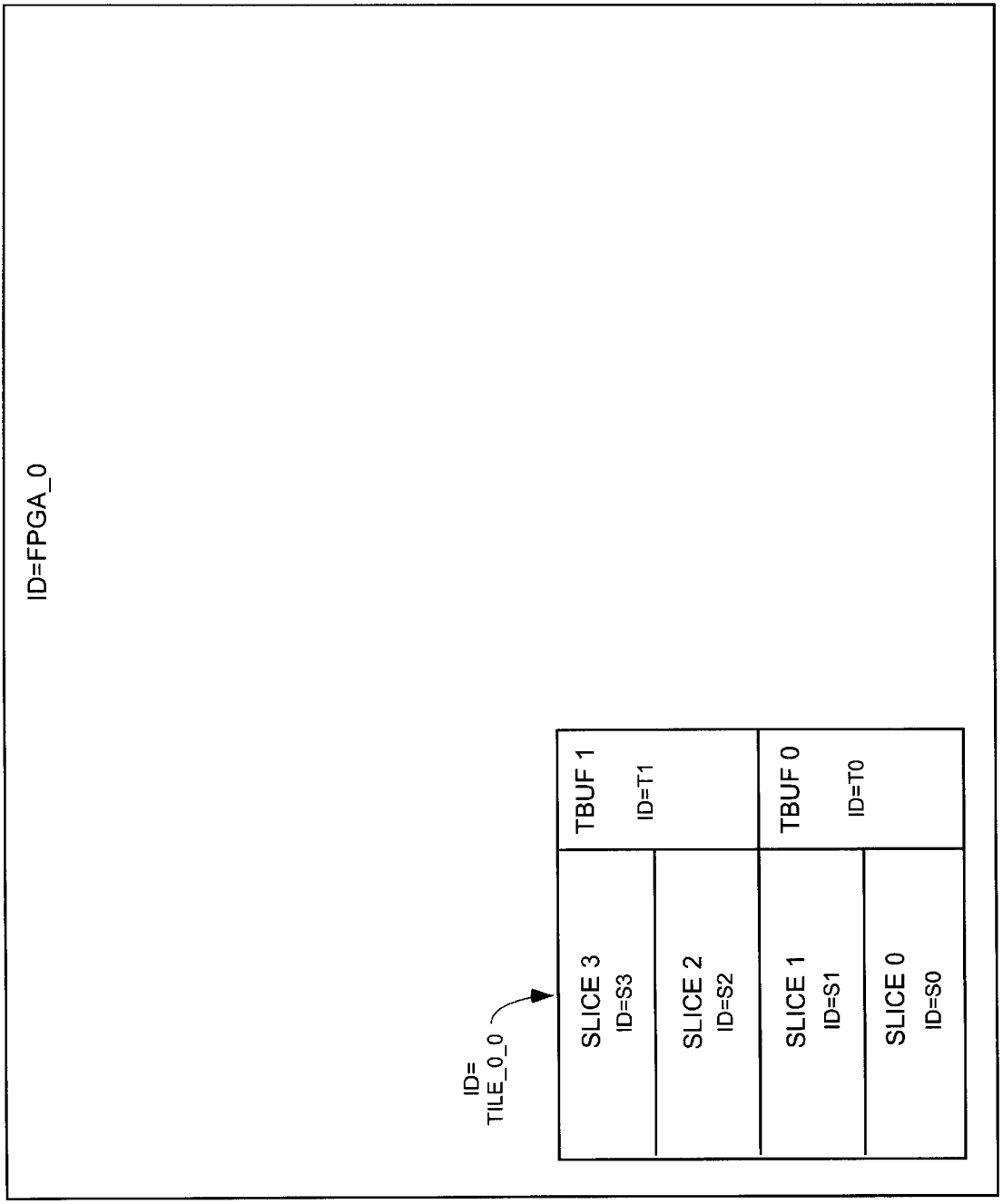
FIG. 6 shows the various levels of hierarchy associated with a representative CLB tile from the system of FIG. 5.

FIG. 6 shows an additional level of hierarchy that may exist in system 500 of FIG. 5. FIG. 6 shows an FPGA FPGA_0 (hierarchical level 1) that includes a CLB located in tile TILE_0_0 (hierarchical level 2). The CLB, in turn, includes four slices SLICE0–3 and two tristate buffers TBUF 0–1. These blocks (i.e., the slices and tristate buffers) form a third level of hierarchy in the system of FIG. 5. Slice 0 of the lower left CLB in FPGA FPGA_0 can be referenced, for example, by attaching the constraint "RLOC=FPGA_0/TILE_0_0/S0". Similarly, the tristate buffer TBUF 0 in the same tile can be referenced by attaching the constraint "RLOC=FPGA_0/TILE_0_0/T0".

Figure 7:
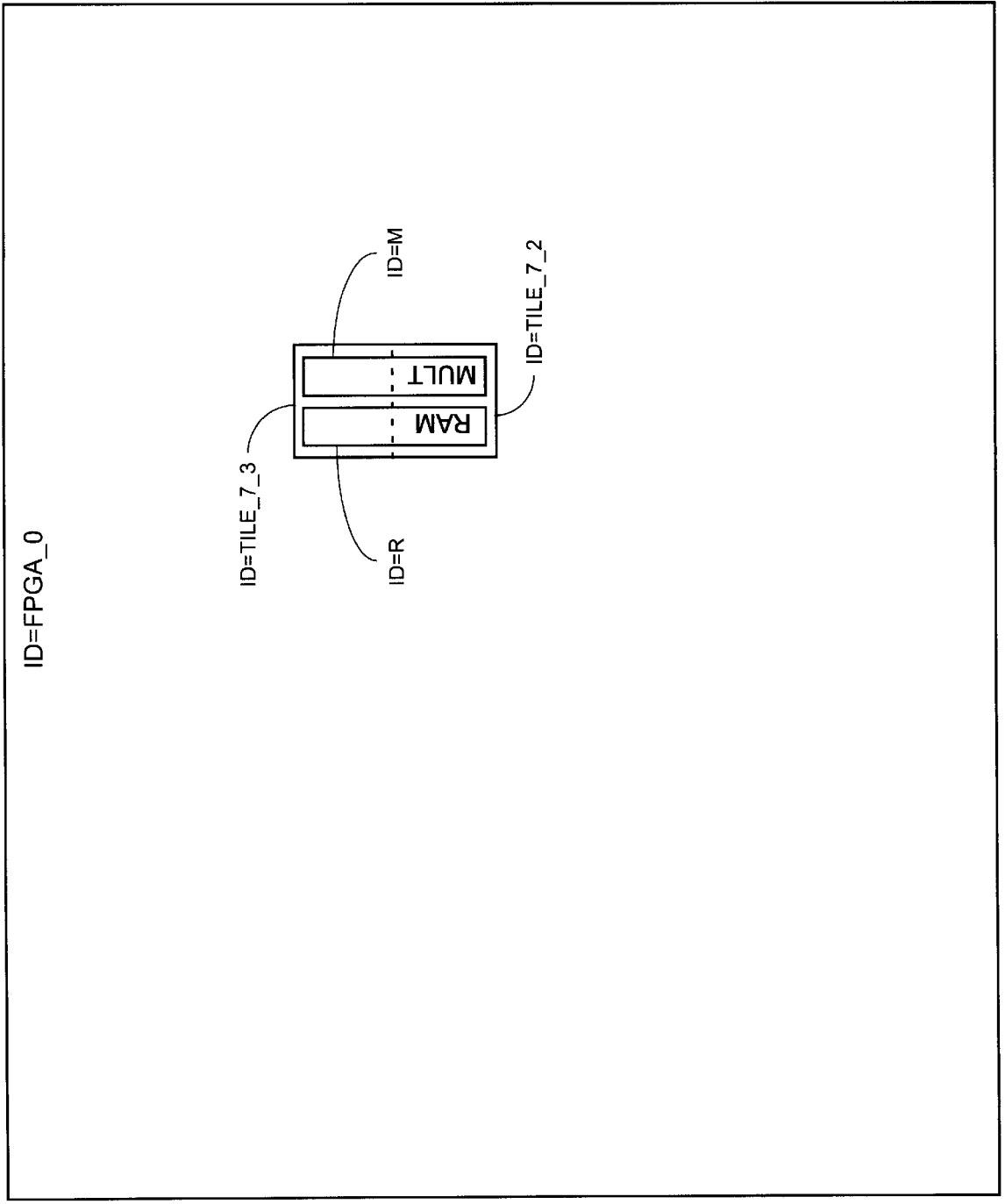
FIG. 7 shows the various levels of hierarchy associated with a RAM/multiplier tile from the system of FIG. 5.

FIG. 7 shows a similar level of hierarchy as FIG. 6 (i.e., another grouping at the third level in system 500), this one including one RAM block and one Multiplier block with their corresponding two tiles. To place a circuit element into the RAM block shown in FIG. 7, the constraint "RLOC=FPGA_0/TILE_7_3/R" can be attached to the element. Similarly, to place a circuit element into the Multiplier block, the constraint "RLOC=FPGA_0/TILE_7_3/M" can be used. In another embodiment, the "TILE_7_2" identifier is used instead of, or interchangeably with, the "TILE_7_3" identifier. In another embodiment, the "/R" and "/M" suffixes are redundant when attached to a circuit element that can only be placed in RAM or Multiplier blocks, respectively. In this embodiment, the implementation software automatically places these elements in the correct logic block if the tile itself is designated.

Figure 8:
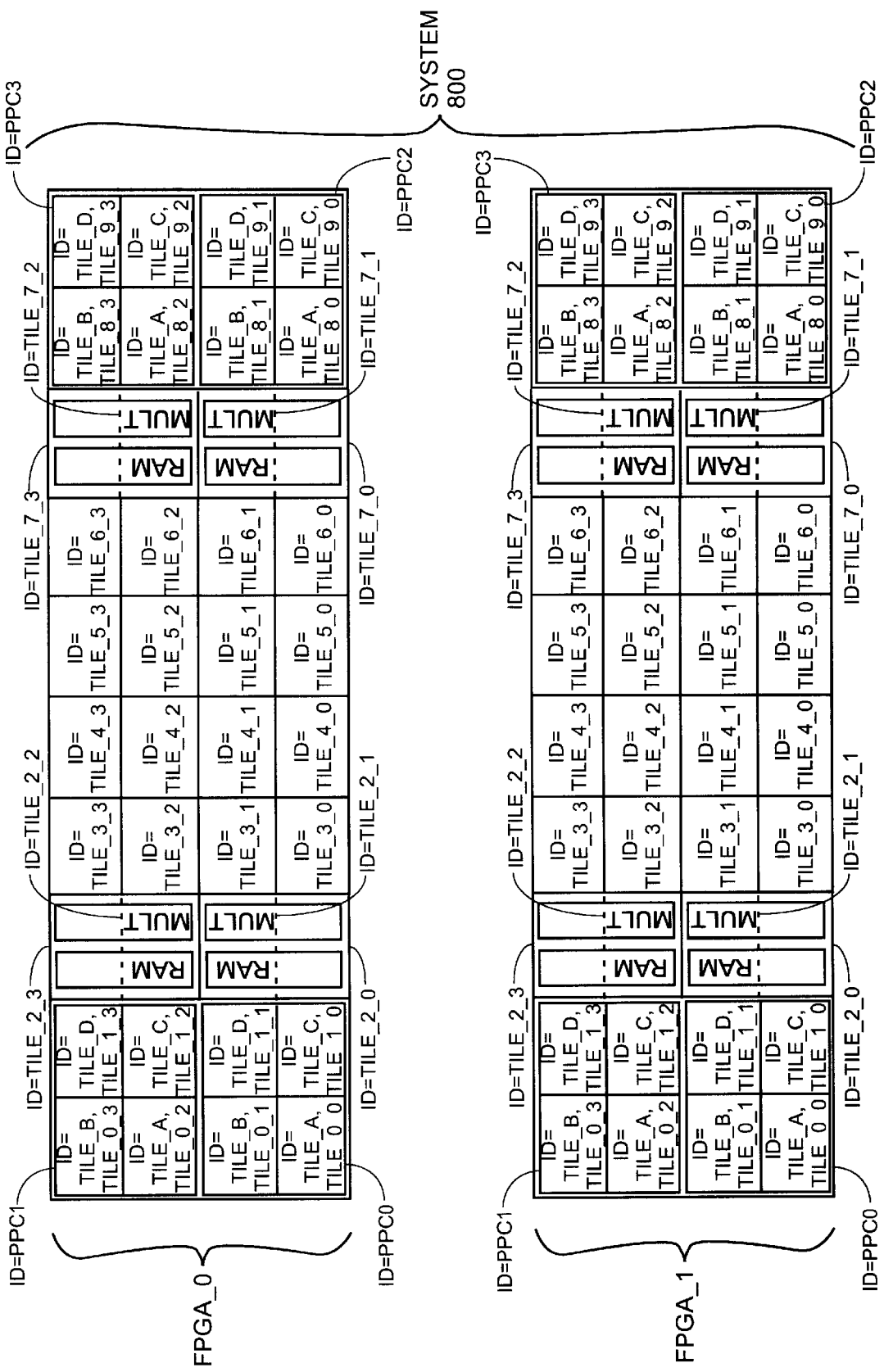
FIG. 8 shows a system including two FPGAs having logic arrays including RAM blocks, multiplier blocks, and processor blocks.

FIG. 8 shows a system 800 that includes another level of hierarchy between the FPGA level and the tile level. Each of FPGAs FPGA_0 and FPGA_1 includes four processor blocks, PPC0–3. In this example, each processor block includes four tiles having identifiers TILE_A-TILE_D. However, the tiles also retain the identifiers assigned to corresponding tiles in system 500 of FIG. 5. Thus, in this embodiment each of the tiles in the processor blocks has two different identifiers. (In another embodiment, each tile has only the identifier shown in FIG. 5, or only the new tile identifier TILE_A-TILE_D.) In the embodiment of FIG. 8, a circuit element can be targeted to the lower left tile of FPGA FPGA_0 using any of the following location constraints, for example: "RLOC=FPGA_0/PPC0/TILE_A"; "RLOC=FPGA_0/TILE_0_0"; or "RLOC=FPGA_0/

PPC0/TILE_0_0. A circuit element can be targeted to any tile in processor PPC0 of FPGA FPGA_0 using the following location constraint: "RLOC=FPGA_0/PPC0". A circuit element can be targeted to the lower left tile of any of the four processors of FPGA FPGA_0 using the location constraint: "RLOC=FPGA_0/TILE_A".

As seen in FIG. 8, more than one tiling and more than one uniform coordinate system can be imposed on the same system and referenced in the same circuit implemented at the same time by the same implementation software. In such systems, two entirely different constraints (e.g., two constraints with different numbers of hierarchical levels) can be used to specify the same location. Preferably, the implementation software detects any conflicting constraints, using methods well known in the art of FPGA implementation software.

Figures 9, 9A:
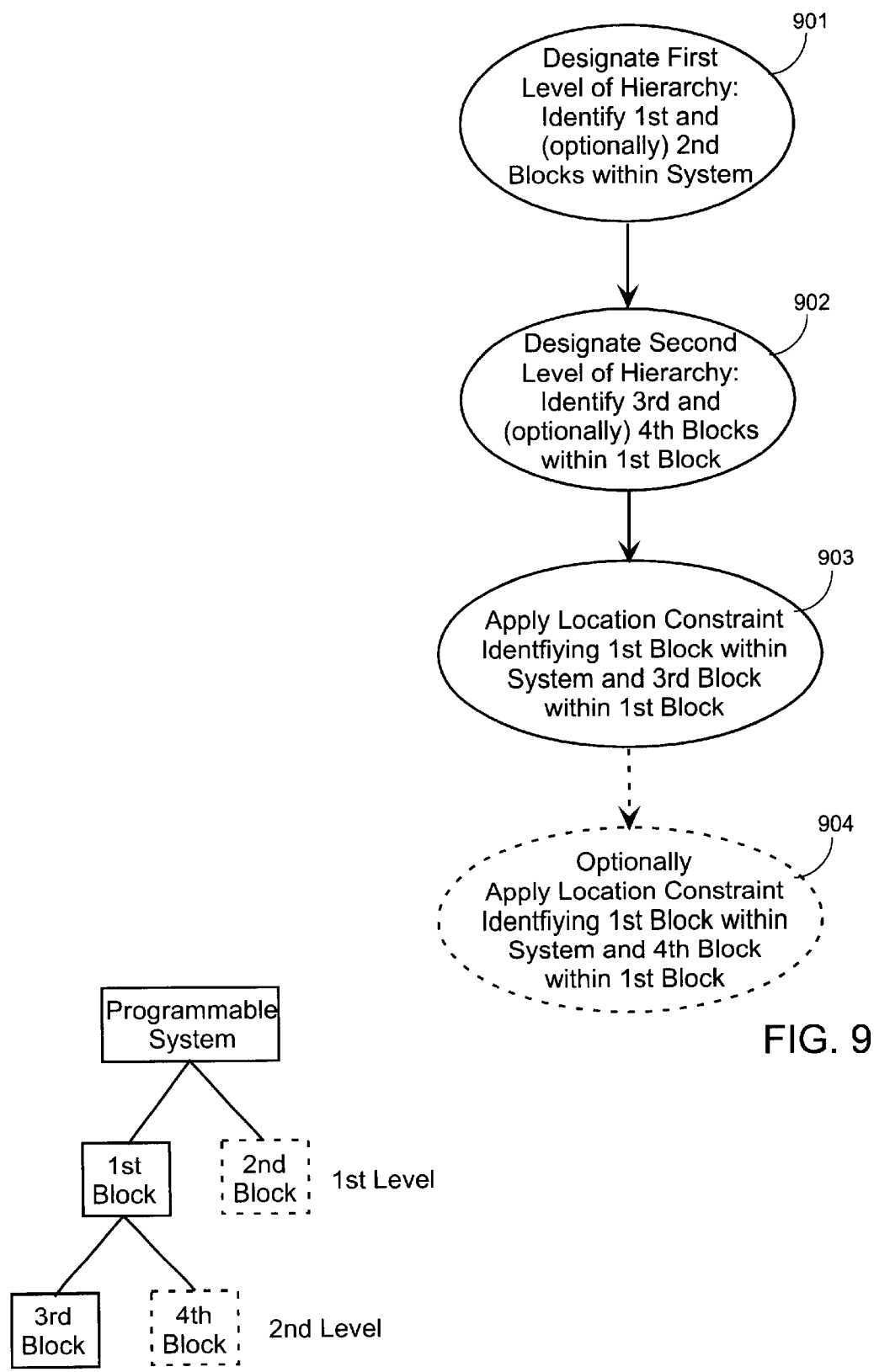
FIG. 9 is a flow diagram showing how a circuit element is constrained in two levels of hierarchy in a system such as those of FIGS. 5 and 8.
FIG. 9A shows the levels of hierarchy implemented by the method of FIG. 9.

FIG. 9 shows the steps of a method of constraining a circuit element in two levels of hierarchy in a system such as those of FIGS. 5 and 8. FIG. 9A shows another programmable system having two levels of hierarchy, to which the steps shown in FIG. 9 can also be applied. Returning to FIG. 9, in step 901 a first level of hierarchy is designated, with at least a first block being designated within the system. Optionally, a second block is also designated within the system. For example, the system of FIG. 9A has a first level of hierarchy including a "1st Block" and a "2nd Block". Similarly, system 500 of FIG. 5 has a first level of hierarchy including the blocks FPGA_0 and FPGA_1.

In step 902, a second level of hierarchy is designated, and at least a third block is identified within the first block. Optionally, a fourth block is also designated within the first block. For example, the system of FIG. 9A has a second level of hierarchy including blocks "3rd Block" and "4th Block" within the "1st Block". Similarly, system 500 of FIG. 5 has a second level of hierarchy for FPGA_0. This second level of hierarchy includes the blocks TILE_0_0 through TILE_9_3.

In step 903, a location constraint is applied to a circuit element, the location constraint identifying both the first block within the system and the third block within the first block. For example, in system 500 of FIG. 5, a single tile can be specified by identifying both the target FPGA within the system, and the target tile within the FPGA, e.g., by attaching the location constraint "RLOC=FPGA_0/TILE_0_0" to the circuit element.

In optional step 904, further location constraints can be applied to other circuit elements. For example, a location constraint can be applied to another circuit element that identifies the first block within the system and the fourth block within the first block. For example, in system 500 of FIG. 5, the location constraint "RLOC=FPGA_0/TILE_0_1" can be attached to another circuit element.

Figures 10, 10A:
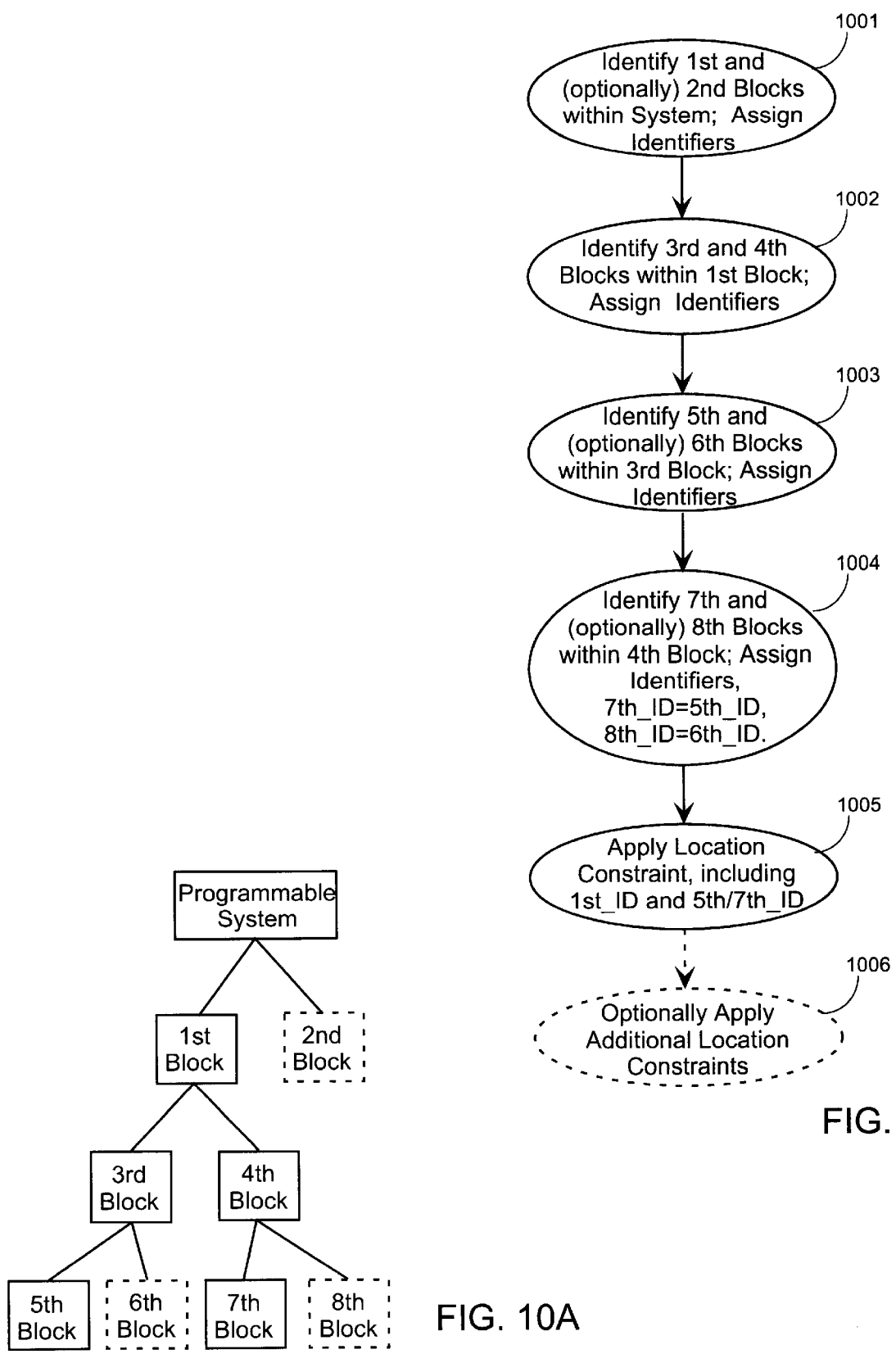
FIG. 10 is a flow diagram showing how a circuit element is constrained in three levels of hierarchy in a system such as those of FIGS. 5 and 8.
FIG. 10A shows the levels of hierarchy implemented by the method of FIG. 10.

FIG. 10 shows the steps of a method of constraining a circuit element in three levels of hierarchy in a system such as that of FIG. 8. FIG. 10A shows another programmable system having three levels of hierarchy, to which the steps shown in FIG. 10 can also be applied. Returning to FIG. 10, in step 1001 at least a first block is identified within the system, and an identifier is assigned to the first block. Optionally, a second block is also identified within the system, and an identifier is assigned to the second block. For example, in the system of FIG. 10A, first and second blocks are identified within the system, and assigned the identifiers "1st_ID" and "2nd_ID", respectively. As another example, in system 800 of FIG. 8, first and second FPGA blocks are identified within the system, and the identifiers "FPGA_0" and "FPGA_1", respectively, are assigned to the blocks.

In step 1002, at least third and fourth blocks are identified within the first block, and identifiers are assigned to these third and fourth blocks. For example, in the system of FIG. 10A, third and fourth blocks are identified within the first block, and assigned the identifiers "3rd_ID" and "4th_ID". As another example, in system 800 of FIG. 8, at least third and fourth processor blocks are identified within FPGA FPGA_0, and the identifiers "PPC0" and "PPC1" are assigned to the blocks.

In step 1003, at least a fifth block is identified within the third block, and an identifier is assigned to the fifth block. Optionally, a sixth block is also identified within the third block, and an identifier is assigned to the sixth block. For example, in the system of FIG. 10A, fifth and sixth blocks are identified within the third block, and assigned the identifiers "5th_ID" and "6th_ID". As another example, in system 800 of FIG. 8, at least fifth and sixth tile blocks are identified within the processor block PPC0 of FPGA FPGA_0, and the identifiers "TILE_A" and "TILE_B" are assigned to the blocks.

In step 1004, at least a seventh block is identified within the fourth block, and an identifier is assigned to the seventh block. Optionally, an eighth block is also identified within the fourth block, and an identifier is assigned to the eighth block. In one embodiment, the identifier assigned to the seventh block is the same as the identifier assigned to the fifth block, and the identifier assigned to the eighth block is the same as the identifier assigned to the sixth block. For example, in the system of FIG. 10A, seventh and eighth blocks are identified within the fourth block. In this embodiment, the identifiers assigned to the seventh and eighth blocks are "5th_ID" and "6th_ID", respectively. As another example, in system 800 of FIG. 8, at least seventh and eighth tile blocks are identified within the processor block PPC1, and the identifiers "TILE_A" and "TILE_B" are assigned to the blocks. Note that these identifiers are the same as those assigned to the tiles in corresponding positions within processor block PPC0 in step 1003.

In step 1005, a location constraint is applied to a circuit element, the location constraint including both the identifier for the first block and the identifier for the fifth block. When the identifier for the fifth and seventh blocks is the same, the implementation software can place the circuit element in either the third block or the fourth block (see FIG. 10A). For example, in the system of FIG. 10A, the location constraint "RLOC=1st_ID/5th_ID" is attached to a circuit element. In an embodiment requiring a placeholder, the constraint "RLOC=1st_ID/*/5th_ID" is attached to the element. As another-example, in system 800 of FIG. 8, the location constraint "RLOC=FPGA_0/TILE_A" or "RLOC=FPGA_0/*/TILE_A" is attached to a circuit element. The implementation software can place the circuit element in the lower left tile of either processor PPC0 or processor PPC1 in FPGA FPGA_0. If the same tile identifier (e.g., TILE_A) is also used in processor blocks PPC2 and PPC3, and these processor blocks are identified in FPGA FPGA_0, the implementation software can place the circuit element in the lower left tile of any of the four processors in FPGA FPGA_0.

In optional step 1006, further location constraints can be applied to other circuit elements. For example, a location constraint can be applied to another circuit element that includes both the identifier for the first block and the identifier for the sixth and eighth blocks. Note that if neither the identifier for the third block nor the identifier for the fourth block is included in either location constraint, the implementation software could place one circuit element in the third block and the other circuit element in the fourth block. However, implementation software that can choose one possible placement over another based on resulting area or speed constraints is well known, and thus the implementation software preferably would select the better of the two placements based on such conditions.

For example, in optional step 1006 as applied to the system of FIG. 10A, the location constraint "RLOC=1st_ID/6th_ID" or "RLOC=1st_ID/*/6th_ID" can be attached to another circuit element. As another example, in system 800 of FIG. 8, the location constraint "RLOC=FPGA_0/TILE_B" or "RLOC=FPGA_0/*/TILE_B" can be attached to another circuit element. The implementation software can place the new circuit element in the upper left tile of either processor PPC0 or processor PPC1.

The same location constraint can be applied to two different circuit elements, provided that the two constraints can both be met. For example, if the constraint "RLOC=FPGA_0/TILE_A" is applied to two different circuit elements, the implementation software can place one element in PPC0 of FPGA FPGA_0 and the other in PPC1 of FPGA FPGA_0.

In the examples of FIGS. 9A and 10A, two blocks are specified at each hierarchical level. However, in some embodiments, only one block is specified at one or more levels of hierarchy, as described with reference to FIGS. 9 and 10. Additional blocks (not shown) can also be specified. Therefore, although FIGS. 9A and 10A show binary trees, this hierarchical organization is purely exemplary. The methods of the invention can also be applied to any other type of tree.

Those having skill in the relevant arts of the invention will now perceive various modifications and additions that may be made as a result of the disclosure herein. Accordingly, all such modifications and additions are deemed to be within the scope of the invention, which is to be limited only by the appended claims and their equivalents.

What is claimed is:

1. A method of hierarchically designating a target location in a programmable system for a circuit element to be implemented in the programmable system, the method comprising:
designating a first level of hierarchy in the programmable system by identifying at least a first block of programmable logic at the first level of hierarchy;
designating a second level of hierarchy within the first block, the second level of hierarchy including at least a third block of programmable logic; and
applying a first location constraint to the circuit element, the first location constraint uniquely identifying the first block within the programmable system, and further uniquely identifying the third block within the first block, wherein
the first level of hierarchy further includes a second block of programmable logic; and
the first and second blocks overlap.

2. The method of claim 1, wherein the third block is included in both the first block and the second block.

3. The method of claim 2, wherein the programmable system comprises at least a portion of a Field Programmable Gate Array (FPGA), the first block is a row of configurable logic blocks (CLBs), the second block is a column of CLBs, and the third block is a CLB.

4. A method of hierarchially designating a target location in a programmable system for a circuit element to be implemented in the programmable system, the method comprising:
designating a first level of hierarchy in the programmable system by identifying at least a first block of programmable logic at the first level of hierarchy;
designating a second level of hierarchy within the first block, the second level of hierarchy including at least a third block of programmable logic;
applying a first location constraint to the circuit element, the first location constraint uniquely identifying the first block within the programmable system, and further uniquely identifying the third block within the first block;
dividing the first block into an array of tiles;
applying a uniform coordinate system to the array of tiles;
determining a set of coordinates for the third block according to the uniform coordinate system by determining the location of the third block within the array of tiles; and
when applying the first location constraint, uniquely identifying the third block within the first block by referencing the set of coordinates.

5. The method of claim 4, wherein the first block is a non-uniform array of different types of logic blocks.

6. The method of claim 5, wherein:
the second level of hierarchy further includes a fourth block of programmable logic; and
the third and fourth blocks are different types of logic blocks.

7. The method of claim 4, wherein the tiles are of uniform size in both dimensions.

8. The method of claim 4, wherein the tiles are of uniform height and varying width.

9. The method of claim 4, wherein the tiles are of uniform width and varying height.

10. A method of hierarchically designating a target location in a programmable system for a circuit element to be implemented in the programmable system, the method comprising:
identifying a first block of programmable logic at the first level of hierarchy and assigning an identifier thereto;
identifying third and fourth blocks of programmable logic within the first block and assigning different identifiers thereto;
identifying a fifth block of programmable logic within the third block and assigning an identifier thereto;
identifying a seventh block of programmable logic within the fourth block and assigning an identifier thereto, the seventh block having the same identifier as the fifth block; and
applying a first location constraint to the circuit element, the first location constraint comprising the identifier assigned to the first block and the identifier assigned to the fifth and seventh blocks.

11. The method of claim 10, wherein applying the first location constraint to the circuit element comprises attaching a text string including the identifier assigned to the first block and the identifier assigned to the fifth and seventh blocks, separated by a delimiter.

12. The method of claim 11, wherein the delimiter is a slash mark.

13. The method of claim 11, wherein the text string further includes a placeholder between the identifier assigned to the first block and the identifier assigned to the fifth and seventh blocks.

14. The method of claim 13, wherein the placeholder is an asterisk.

15. The method of claim 10, wherein the first block is Field Programmable Gate Array (FPGA).

16. The method of claim 10, wherein the programmable system is at least a portion of a Field Programmable Gate Array (FPGA).

17. The method of claim 16, wherein the third block is a non-uniform array of different types of logic blocks.

18. The method of claim 17, further comprising:
identifying a sixth block of programmable logic within the third block and assigning an identifier thereto, the identifier assigned to the sixth block being different from the identifier assigned to the fifth block,
wherein the fifth and sixth blocks are different types of logic blocks.

19. The method of claim 10, further comprising:
dividing the third block into an array of tiles;
applying a uniform coordinate system to the array of tiles;
determining a set of coordinates for the fifth block according to the uniform coordinate system by determining the location of the fifth block within the array of tiles; and
referencing the set of coordinates when assigning an identifier to the fifth block within the third block.

20. The method of claim 19, wherein the third block is a non-uniform array of different types of logic blocks.

21. The method of claim 20, further comprising:
identifying a sixth block of programmable logic within the third block and assigning an identifier thereto, the identifier assigned to the sixth block being different from the identifier assigned to the fifth block,
wherein the fifth and sixth blocks are different types of logic blocks.

22. The method of claim 19, wherein the tiles are of uniform size in both dimensions.

23. The method of claim 19, wherein the tiles are of uniform height and varying width.

24. The method of claim 19, wherein the tiles are of uniform width and varying height.

25. The method of claim 10, further comprising:
identifying a sixth block of programmable logic within the third block and assigning an identifier thereto, the identifier assigned to the sixth block being different from the identifier assigned to the fifth block;
identifying an eighth block of programmable logic within the fourth block and assigning an identifier thereto, the eighth block having the same identifier as the sixth block; and
applying a second location constraint to another circuit element, the second location constraint comprising the identifier assigned to the first block and the identifier assigned to the sixth and eighth blocks.

26. The method of claim 10, further comprising applying a second location constraint to another circuit element, the second location constraint comprising the identifier assigned to the first block and the identifier assigned to the fourth block.

27. The method of claim 10, further comprising:
identifying a sixth block of programmable logic within the third block and assigning an identifier thereto, the identifier assigned to the sixth block being different from the identifier assigned to the fifth block;
identifying an eighth block of programmable logic within the fourth block and assigning an identifier thereto, the eighth block having the same identifier as the sixth block; and applying a second location constraint to another circuit element, the second location constraint comprising the identifier assigned to the fourth block and the identifier assigned to the sixth and eighth blocks.

28. A method of designating a target logic block in a non-uniform programmable array of logic blocks, the method comprising:
dividing the non-uniform programmable array into an array of tiles, with each logic block corresponding to one or more tiles;
applying a uniform coordinate system to the array of tiles;
determining a set of coordinates for the target logic block according to the uniform coordinate system by determining the location within the array of tiles of the one or more tiles corresponding to the target logic block; and
applying a first location constraint to a circuit element to be implemented in the target logic block, the first location constraint identifying the target logic block by referencing the set of coordinates.

29. The method of claim 28, wherein the programmable array is at least a portion of a Field Programmable Gate Array (FPGA).

30. The method of claim 28, wherein the tiles are of uniform size in both dimensions.

31. The method of claim 28, wherein the tiles are of uniform height and varying width.

32. The method of claim 28, wherein the tiles are of uniform width and varying height.

33. The method of claim 28, further comprising applying a second location constraint to another circuit element to be implemented in a second logic block in the programmable array.

34. The method of claim 33, wherein the target logic block corresponds to a first number of tiles, the second logic block corresponds to a second number of tiles, and the first and second numbers of tiles are different.

35. The method of claim 28, wherein the target logic block corresponds to a single tile.

36. The method of claim 28, wherein:
the target logic block corresponds to at least two tiles; and
determining the set of coordinates comprises determining the location, within the array of tiles, of the tile at a given corner of the at least two tiles corresponding to the target logic block.

37. The method of claim 28, wherein at least one tile corresponds to a plurality of logic blocks.

38. The method of claim 37, wherein the plurality of logic blocks are of at least two different types.

* * * * *